United States Patent [19]
McGowan et al.

[11] Patent Number: 5,952,852
[45] Date of Patent: Sep. 14, 1999

[54] FAST WIDE DECODE IN AN FPGA USING PROBE CIRCUIT

[75] Inventors: John E. McGowan, Sunnyvale; William C. Plants, Santa Clara; Warren K. Miller, Palo Alto, all of Calif.

[73] Assignee: Actel Corporation, Sunnyvale, Calif.

[21] Appl. No.: 08/887,380

[22] Filed: Jul. 2, 1997

[51] Int. Cl.⁶ .................... H03K 19/177; H03K 19/08
[52] U.S. Cl. .................... 326/106; 326/39; 326/105
[58] Field of Search .................... 326/16, 105–106, 326/39, 41, 112, 119, 121

[56] References Cited

U.S. PATENT DOCUMENTS

| | | |
|---|---|---|
| 4,758,745 | 7/1988 | Elgamal et al. . |
| 4,763,020 | 8/1988 | Takata et al. . |
| 4,771,285 | 9/1988 | Agrawal et al. .................... 340/825.83 |
| 4,870,302 | 9/1989 | Freeman . |
| 4,983,959 | 1/1991 | Breuninger .................... 340/825.83 |
| 5,028,821 | 7/1991 | Kaplinsky . |
| 5,075,576 | 12/1991 | Cavlan . |
| 5,220,213 | 6/1993 | Chan et al. . |
| 5,262,994 | 11/1993 | McClure .................... 365/200 |
| 5,448,185 | 9/1995 | Kaptanoglu .................... 326/39 |
| 5,506,518 | 4/1996 | Chiang .................... 326/41 |

*Primary Examiner*—Jon Santamauro
*Attorney, Agent, or Firm*—D'Alessandro & Ritchie

[57] ABSTRACT

In a first aspect of the present invention, implementing a fast, wide decode in a field programmable gate array by selecting a test probe circuit associated with a column in the array, selecting at least one logic module associated with the test probe circuit, driving the test probe circuit in the at least one logic module by an output of the at least one logic module, and sensing a logic level in the test probe circuit to determine whether a match in the decode at the inputs of the at least one logic module occurred.

In a second aspect of the present invention, implementing a fast, wide decode in a field programmable gate array by selecting a plurality of test probe circuits, each associated with a column in the array, selecting at least one logic module associated with each of the test probe circuits, driving the test probe circuit in the at least one logic module by an output of the at least one logic module, and sensing a logic level in the test probe circuit to determine whether a match in the decode at the inputs of the at least one logic module occurred.

8 Claims, 6 Drawing Sheets

FAST WIDE DECODE IN AN FPGA USING PROBE CIRCUIT

BACKGROUND OF THE INVENTION

1. Field of the Invention

The present invention relates to field programmable gate array (FPGA) circuits. More particularly, the present invention relates to implementing a fast wide decode circuit in an FPGA using probe circuitry present in the FPGA for testing.

2. The Prior Art

Digital addressing schemes and decoding of digital addresses are well known in the art. In many of these addressing schemes, specific addresses are decoded to access a single device in a system. For example, in a computer system specific addresses are provided to access internal memory, external memory, peripherals, etc. Since many of these devices are accessed frequently, it is advantageous to decode the addresses for these devices quickly. Often, the addresses in conventional addressing schemes are represented by 8 to 64 bits. Thus, it is advantageous for the decoding circuitry of an often used address to not only be fast, but to also be wide enough to process all of the bits in the address.

FPGA's typically are comprised of identical logic modules which may be programmed to provide specific logic functions. The inputs and outputs of the logic modules are connected to one another, and to I/O pads and I/O buffers, etc., by an interconnect architecture scheme. It is well known in the art that FPGA's are employed to form custom circuits and to design circuits for more general use. These circuits often require the fast, wide decode of an address as described above. In FPGA's there have been at least two approaches to providing a fast, wide decode.

In one approach, for example, to quickly decode a 32-bit address, several of the logic function modules will be programmed so that the inputs and outputs of the logic modules correspond to the desired address. When the logic modules in the FPGA have 4 inputs and a single output, a total of eleven logic modules are required to decode a 32-bit address. In a typical addressing scheme, eight logic modules will be used to observe the address, and the outputs of the eight logic modules will be cascaded into two additional logic modules whose outputs will be further cascaded into another module whose output will be connected to an I/O pad. This decoding scheme requires a substantial number of logic modules, and the speed of the decode is less than ideal.

In another approach, the eight 4-bit input logic modules may be cascaded into a special 8-input-wide module whose output is connected to an output pad. Though this alternative improves the speed of the decode, the 8-input logic module utilizes a substantial amount of routing resources to function.

It is therefore an object of the present invention to provide a fast, wide address decode which reduces the delay in the decoding.

It is another object of the present invention to provide a fast, wide address decode which utilizes routing resources implemented for a test probe feature.

BRIEF DESCRIPTION OF THE INVENTION

According to the present invention a fast, wide decode is implemented in a field programmable gate array arranged as rows and columns of logic modules and having a test probe circuit associated with each column of the logic modules, each test probe circuit including a first row select portion disposed in each of the logic modules, and a second column portion associated with each of the columns.

In a first aspect of the present invention, the method of implementing the fast wide decode comprises the steps of: selecting a plurality of test probe circuits by driving the second column portion of each of said plurality of test probe circuits with an electrical signal sufficient to select said plurality of test probe circuits; selecting at least one logic module associated with each of said plurality of said test probe circuits by driving the first row select portion of said at least one logic module with an electrical signal sufficient to select said at least one logic module; driving said first row select portion of said at least one logic module by an output of said at least one logic module; and sensing a logic level in each second column select portion of said plurality of test probes circuit to determine whether a match in the decode at the inputs of said at least one logic module occurred.

In a second aspect of the present invention, the method of implementing the fast wide decode comprises the steps of: selecting a test probe circuit by driving the second column portion of said test probe circuit with an electrical signal sufficient to select said second test probe circuit; selecting at least one logic module associated with said test probe circuit by driving the first row select portion of said at least one logic module with an electrical signal sufficient to select said at least one logic module; driving said first row select portion of said at least one logic module by an output of said at least one logic module; and sensing a logic level in each second column select portion of said test probe circuit to determine whether a match in the decode at the inputs of said at least one logic module occurred.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

As is well known in the art, an FPGA is a collection of logic function modules which may be configured by user programmable interconnect elements to implement a large variety of digital logic functions. A programmable interconnect architecture, comprising a plurality of initially uncommitted interconnect conductors is superimposed over the array of logic function modules to enable custom connections to be made among the inputs and outputs of individual ones of logic function modules by user programmable elements to form digital circuits. The user programmable interconnect elements in both the logic function modules and the interconnect architecture may take several forms, such as one time programmable antifuse elements, pass transistors controlled by RAM cells, EPROM cells, etc. These forms of user programmable interconnect elements are well known to those of ordinary skill in the art.

The logic function modules may be any one of a variety of circuits, including, for example, the logic modules disclosed in U.S. Pat. No. 4,758,745 to El Gamal, et al., U.S. Pat. No. 4,873,459 to El Gamal, et al., U.S. Pat. No. 4,910,417 to El Gamal, et al., U.S. Pat. No. 5,015,885 to El Gamal, et al., U.S. Pat. No. 5,451,887 to El Ayat, et al., and U.S. Pat. No. 5,477,165 to El Ayat, et al., U.S. Pat. No. 5,055,718 to Galbraith, et al., U.S. Pat. No. 5,198,705 to Galbraith, et al., U.S. Pat. No. 5,440,245, to Galbraith, et al., U.S. Pat. No. 5,448,185 to Kaptanoglu, U.S. Pat. No. 5,479,113 to El Gamal, et al., U.S. Pat. No. 5,570,041 to El Ayat, et al., U.S. Pat. No. 5,606,267 to El Ayat, et al., and Ser. No. 08/505,830 to Galbraith, et al., assigned to the same assignee as the present invention, and expressly incorporated herein by reference. Present in the logic modules shown therein, is probe circuitry used to test the integrity of each module prior to and after programming. In the present invention, a fast wide decode is implemented in an FPGA using the logic module test probe circuitry.

Examples of several aspects of antifuse based FPGA architectures are disclosed in U.S. Pat. No. 4,758,745 to El Gamal, et al., U.S. Pat. No. 4,873,459 to El Gamal, et al., U.S. Pat. No. 5,073,729 to Greene, et al., U.S. Pat. No. 5,083,083 to El Ayat, et al., U.S. Pat. No. 5,132,571 to McCollum, et al., U.S. Pat. No. 5,172,014 to El Ayat, U.S. Pat. No. 5,187,393 to El Ayat, et al., U.S. Pat. No. 5,191,241 to McCollum, et al., U.S. Pat. No. 5,317,698 to Chan, et al., U.S. Pat. No. 5,367,208 to El Ayat, et al., U.S. Pat. No. 5,451,887 to El Ayat, et al., U.S. Pat. No. 5,477,165 to El Ayat, et al., U.S. Pat. No. 5,509,128 to Chan, et al., U.S. Pat. No. 5,510,730 to El Gamal, et al., U.S. Pat. No. 5,537,056 to McCollum, U.S. Pat. No. 5,570,041 to El Ayat, et al., U.S. Pat. No. 5,606,267 to El Ayat, et al., and Ser. No. 08/575,519, El Gamal, et al., assigned to the same assignee as the present invention, and expressly incorporated herein by reference.

Figure 1:
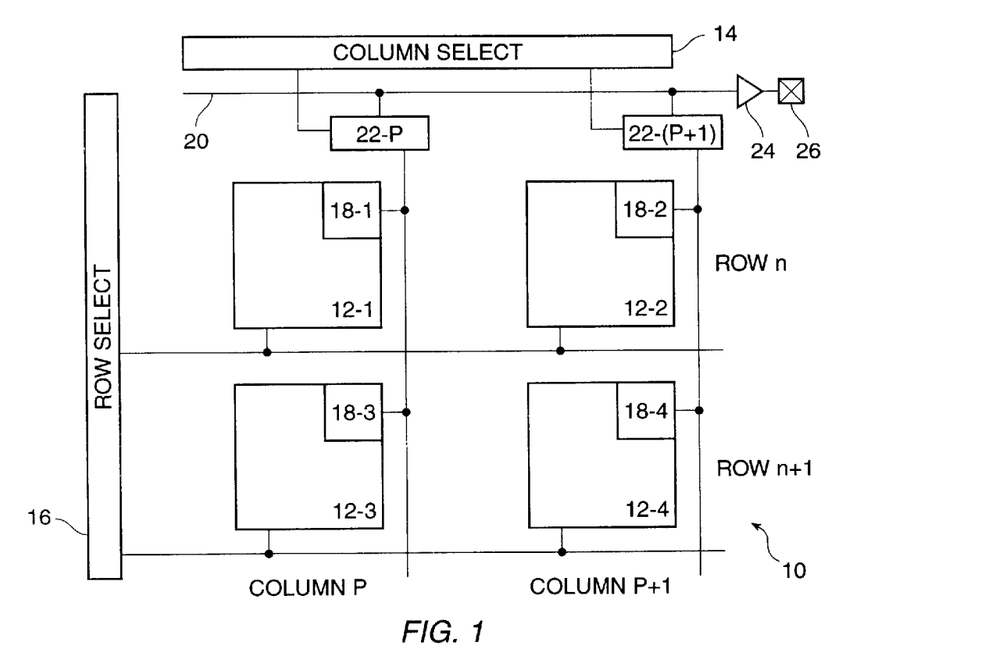
FIG. 1 is a block diagram of a FPGA architecture with logic modules and test probe circuits according to the present invention.

Referring now to FIG. 1, a simplified schematic diagram of a FPGA architecture 10 is shown with logic module blocks 12-1 through 12-4. Most of the details of the FPGA architecture 10 are omitted to avoid over complicating the disclosure and obscuring the present invention. In the FPGA architecture 10, the logic modules 12 are arranged in an array of rows and columns. Logic modules 12-1 and 12-2 are in row n, and logic modules 12-3 and 12-4 are in row n+1, while logic modules 12-1 and 12-3 are in column p, and logic modules 12-2 and 12-4 are in column p+1.

Figure 2:
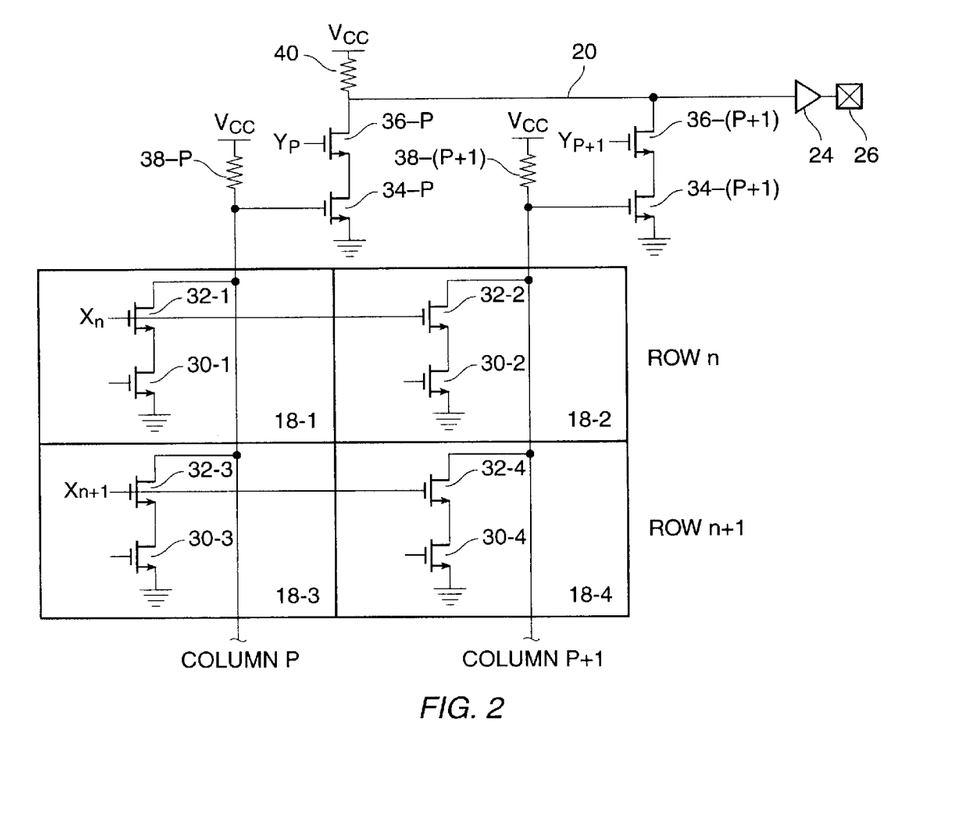
FIG. 2 is circuit diagram of a first embodiment of the test probe circuit blocks as shown in FIG. 1 according to the present invention.
Figure 6:
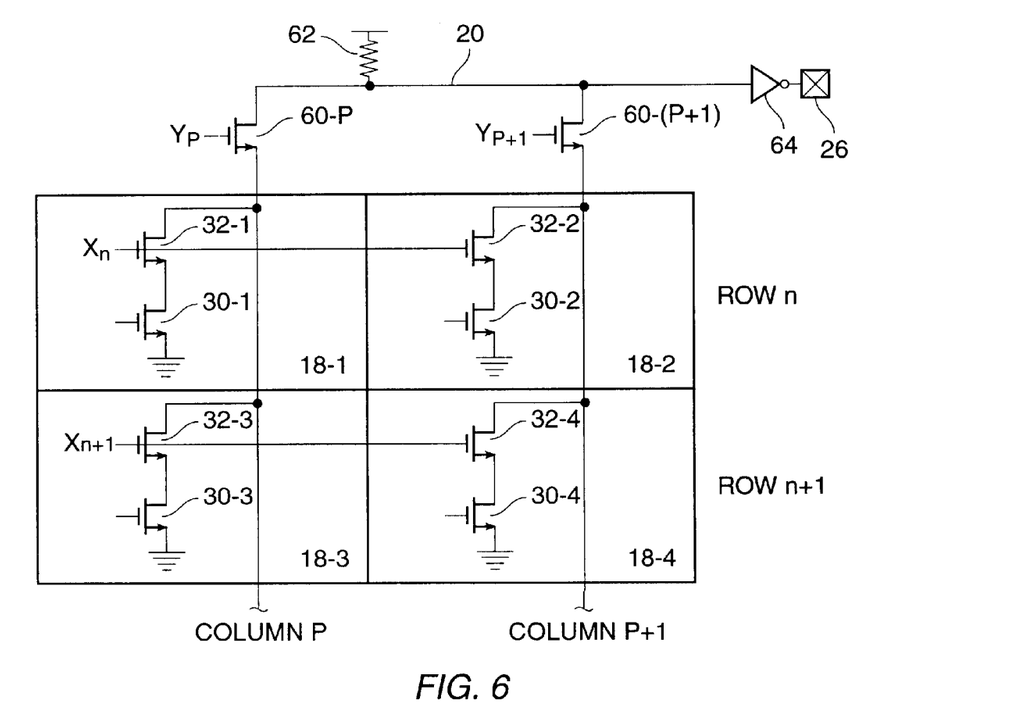
FIG. 6 is circuit diagram of a second embodiment of the test probe circuit blocks as shown in FIG. 1 according to the present invention.

Column select register 14 and row select register 16 are used to select any logic module 12 in the array by decoding the row and column location, respectively, of the selected logic module 12. Disposed in each logic module 12-1 through 12-4 is a first portion of a test probe circuit 18-1 through 18-4, respectively. The output from any selected logic module 12 will appear on a single output line 20 due to the first portion of the test probe circuit 18 associated with that logic module 12 and the second portion of the test probe circuit 22 associated with each of the logic modules 12 in the same column as the selected logic module 12. Typically, the output line 20 is connected to a sense amplifier 24 whose buffered output is connected to an I/O pad 26. In FIGS. 2 and 6, first and second embodiments, respectively, of the first and second portions of the test probe circuits 18 and 22 are illustrated.

Referring now to FIG. 2, the first embodiment of the first and second portions of the test probe circuits 18 and 22 shown in FIG. 1 as block diagrams are depicted schematically. The same elements in FIGS. 1 and 2 are given the same reference numerals to avoid over complicating the disclosure and thereby obscuring the present invention. In each first portion of the test probe circuits 18 associated with each logic module 12 there are first and second N-channel MOS transistors 30 and 32. The gate of first N-channel MOS transistor 30 is connected to the output of the logic module 12, and the gate of second N-channel MOS transistor 32 is connected to the row select line with which the logic module 12 is associated. The source of first N-channel MOS transistor 30 is connected to ground, and the drain of first N-channel MOS transistor 30 is connected to the source of second N-channel MOS transistor 32.

The second portion of the test probe circuit 22 associated with each column of logic modules 12 includes third and fourth N-channel MOS transistors 34 and 36. The drains of each of the second N-channel MOS transistors 32 from each first portion of the test probe circuits 18 in each separate column are connected to the gate of the third N-channel MOS transistor 34 in the second portion of the test probe circuit 22 associated with that column. Each gate of the third N-channel MOS transistors 34 is also connected to a separate first load resistor 38 connected to Vcc. Those of ordinary skill in the art will recognize that first load resistor 38 may be implemented in several ways, including a P-channel MOS transistor having a gate tied to ground.

The gate of the fourth N-channel MOS transistor 36 is connected to a column select line for selecting the column with which the second portion of the test probe circuit 22 is associated. The source of the fourth N-channel MOS transistor 36 is connected to the drain of the third N-channel MOS transistor 34. The drain of the fourth N-channel MOS transistor 36 is connected to a second load resistor 40 which is connected to Vcc. The drain of the fourth N-channel MOS transistor 36 is also connected to output line 20, along with the drains of each of the other fourth N-channel MOS transistors 36 in the second portions of the test probe circuits 22. Those of ordinary skill in the art will recognize that second load resistor 40 may be implemented in several different ways, including a P-channel MOS transistor having a gate tied to ground. As previously described, the output line 20 is connected to a sense amplifier 24 whose output is connected to an output pad 26.

In the embodiment of the present invention illustrated in FIG. 2, the first portions of the test probe circuits 18 in each column form a distributed or wired NOR function performed on the outputs of the logic modules 12 in the same column, and the second portion of the test probe circuitry 22 forms an inverter. The NOR function formed by the first portions of the test probe circuits 18 can be readily observed. When a HIGH signal from a logic module is presented to one of the N-channel MOS transistors 30 and the N-channel MOS transistor 32 in the pair is also selected, the input to the gate of the N-channel MOS transistor 34 will be LOW. Whereas, when each of the logic module outputs presented to an N-channel MOS transistor 30 in a selected transistor pair is a LOW signal, the input to the gate of the N-channel MOS transistor 34 will be HIGH. The inverter formed by N-channel MOS transistors 34 and 36 is well known to those of ordinary skill in the art.

According to one embodiment of the present invention, logic modules in a selected column are selected to form the fast wide decode. The column is selected by applying an electrical signal representing a HIGH logic level to the gate of N-channel MOS transistor 36 in the column being selected, and the logic modules are selected by applying an electrical signal representing a HIGH logic level to the gates of N-channel MOS transistors 32 in the logic modules being selected. Each of the selected logic modules are programmed to implement a portion of the decode. When the inputs to a selected logic module match the decode implemented in the logic module, an electrical signal representing a LOW logic level drives the gate of N-channel MOS transistor 30 in that logic module to indicate a match in the decode. The output of the decode is then sensed on an output line 20.

Figure 3A:
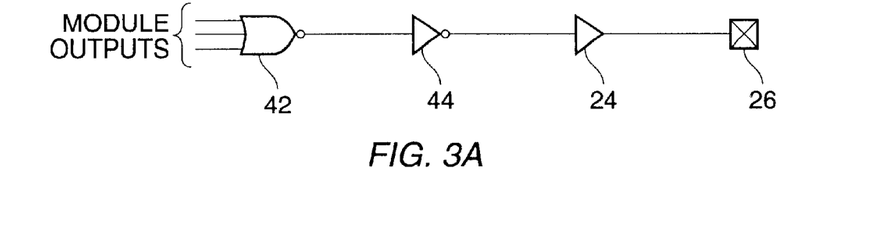
FIG. 3A is a schematic circuit diagram for a test probe circuit according to the present invention as shown in FIG. 2.

In FIG. 3A, a simplified schematic circuit diagram for a test probe circuit associated with a single column is illustrated with the outputs of the logic modules in the same column being input to the NOR gate 42 formed by the first portions of the test probe circuits 18, and the output of NOR gate 42 being input to inverter 44 formed by the second portion of the test probe circuitry 22. The output of inverter 44 is connected to sense amplifier 24.

Figure 3B:
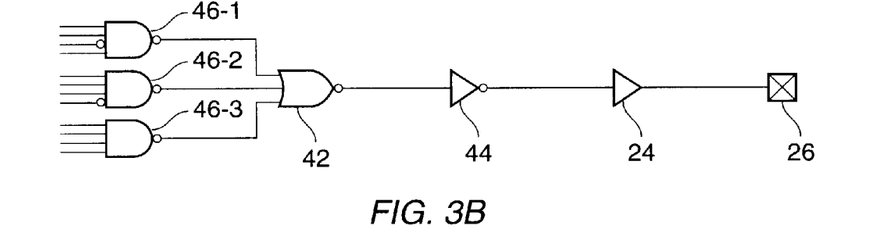
FIG. 3B is a schematic circuit diagram for a test probe circuit including logic function modules according to the present invention.
Figure 3C:
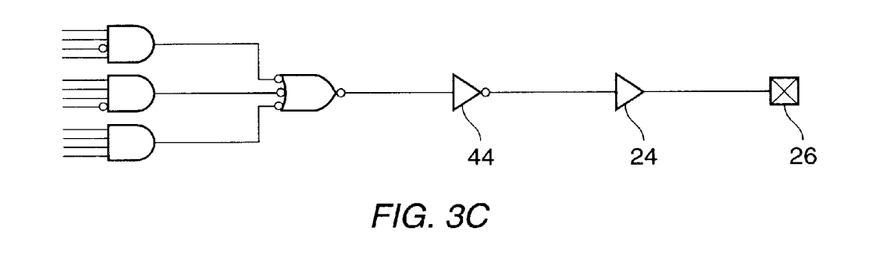
FIG. 3C is a simplified logic diagram of FIG. 3B according to the present invention.

In FIG. 3B, the four-input NAND gates 46-1 through 46-3 represent logic modules in the FPGA. Some of the inputs to NAND gates 46-1 through 46-3 are inverted for illustrative purposes only. It should be appreciated that any or all of the inputs may be inverted as required by the specific address being decoded. Generally, n four-input NAND gates 46 can implement a decoder capable of decoding an address of 4n bits. The outputs of the NAND gates 46-1 through 46-3 are connected to the circuit shown in FIG. 3A. As will be appreciated by those of ordinary skill in the art, FIGS. 3C and 3D are simplified logic diagrams of FIG. 3B.

Figure 3D:
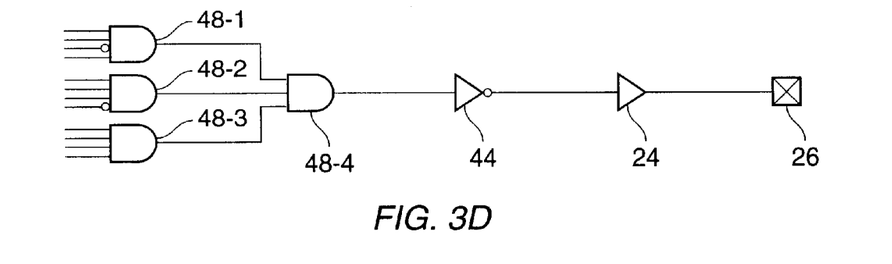
FIG. 3D is a simplified logic diagram of FIG. 3C according to the present invention.

Turning specifically to FIG. 3D, the address decoding of the present invention is more readily apparent. As is well known in the art, an AND gate with inverted inputs can be used as a decoder. Accordingly, the AND gates 48-1 through 48-4 are equivalent to a single AND gate with inverted inputs that may be employed for address decoding. A HIGH output from AND gate 48-4 indicates a match in the decode, and as a consequence of inverter 44, the output from the sense amplifier 24 will be active LOW.

Figure 4A:
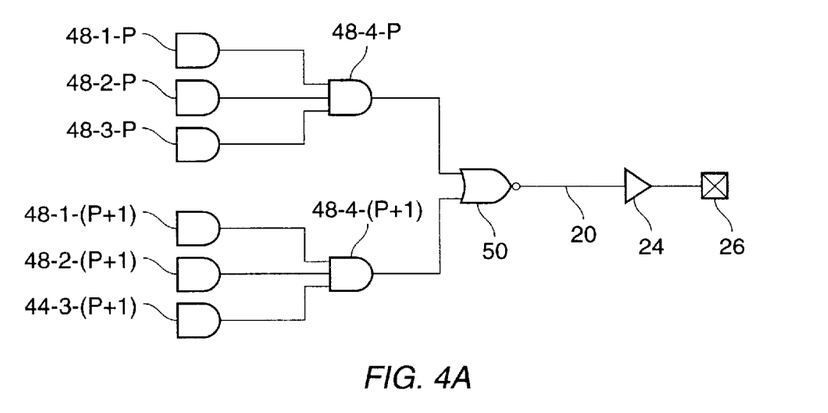
FIG. 4A is a schematic circuit diagram for a plurality of test probe circuits and logic function modules according to the present invention.

Turning again to FIG. 2, when the inverters formed by the N-channel MOS transistor pair 34 and 36 in each of the columns are connected together on output line 20, a NOR logic function is performed. FIG. 4A is a simplified schematic circuit diagram (shown without the inputs to the logic modules) of FIGS. 2 and 3D wherein multiple columns are tied together by their inverter outputs. In FIG. 4A, each of the column a circuits is depicted by the schematic circuit diagram for a column illustrated in FIG. 3D, and NOR gate 50 depicts the inverters 44 (of FIG. 3D) being tied to the same output line 20. When only a single column is used in the decode circuit, NOR gate 50 does not present a problem, however, when multiple columns are employed to form the decode circuit, a match of the portion of the address supplied to any one of the columns may erroneously indicate that a match has been made of the address to all of the columns being used in the decode.

Figure 4B:
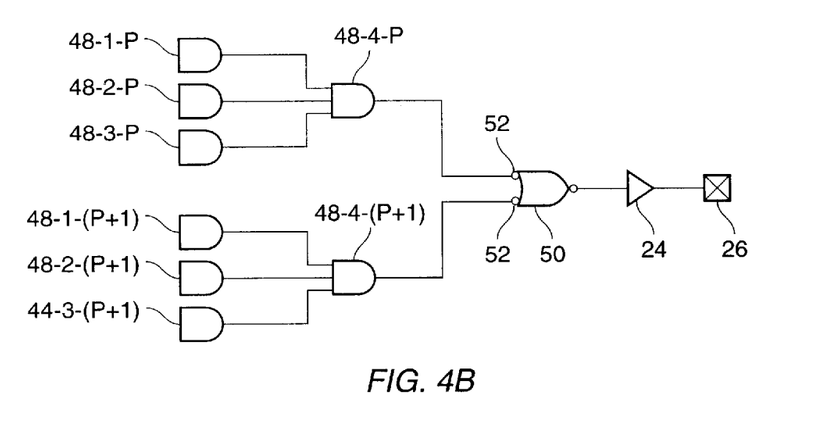
FIG. 4B is a schematic circuit diagram as shown in FIG. 4A for a plurality of test probe circuits having inverted outputs according to the present invention.
Figure 4C:
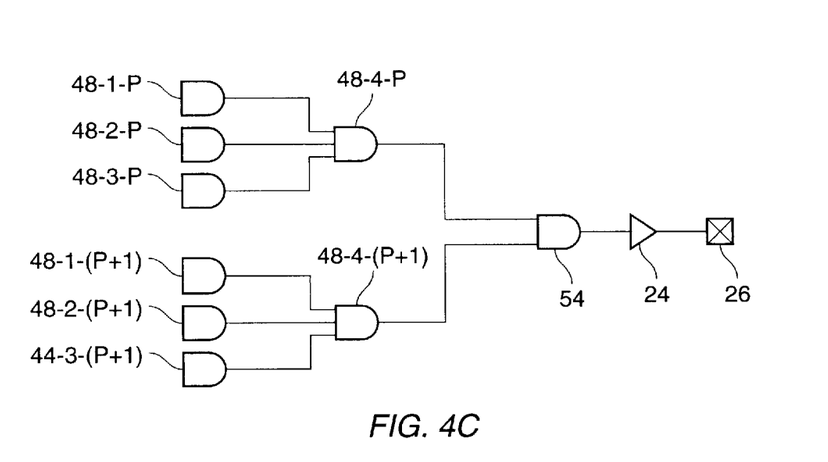
FIG. 4C is a simplified logic diagram of FIG. 4B according to the present invention.

In FIG. 4B, to avoid the restriction of the decode circuit to a single column, an additional inversion 52 is added to the output of each column. In FIG. 4C, a simplified logic diagram of FIG. 4B is illustrated wherein the NOR gate 48 with inverted inputs 52 shown in FIG. 4B is depicted as an AND gate 54 in FIG. 4C. It will be appreciated that the AND gates 48 and 54 form a single AND function. Accordingly, with the additional inversion to the output of each column, the output of the decode illustrated in FIG. 4C will be active HIGH.

Figure 5:
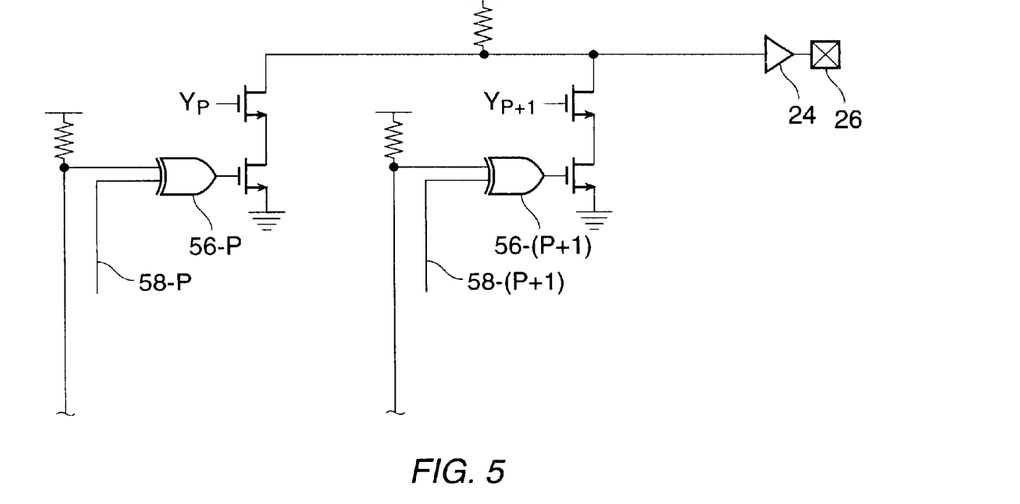
FIG. 5 illustrates programmable inverted outputs for test probe circuits suitable for use in the present invention.

The additional inversion at the output of each column must be programmable so that it can be deactivated when the circuitry is being implemented as a logic probe, and activated when the fast, wide decode circuit is being employed. In FIG. 5, the inversion at the output of each column is illustrated by the exclusive-or (XOR) gate 56. As will be appreciated by those of ordinary skill in the art, a HIGH signal at XOR input 58 will invert the column output at the output of the XOR gate 56, while a LOW signal at XOR input 58 will not invert the column output at the output of the XOR gate 56. In this manner, the additional inversion is made programmable so that it may activated or deactivated as desired. It should also be appreciated that XOR gate 56 may also be used to implement either an active HIGH or an active LOW single column decoder Referring now to FIG. 6, the second embodiment of the first and second portions of the test probe circuits 18 and 22 shown in FIG. 1 in block diagrams are depicted schematically. The same elements in FIGS. 1 and 6 are given the same reference numerals to avoid over complicating the disclosure, and thereby obscuring the present invention. In each of the first portions of the test probe circuits 18 associated with each logic module 12 there are first and second N-channel MOS transistors 30 and 32. The gate of first N-channel MOS transistor 30 is connected to the output of the logic module 12, and the gate of second N-channel MOS transistor 32 is connected to the row select line with which the logic module 12 is associated. The source of first N-channel MOS transistor 30 is connected to ground, and the drain of first N-channel MOS transistor 30 is connected to the source of second N-channel MOS transistor 32.

The second portion of the test probe circuit 22 associated with each column of logic modules 12 includes third N-channel MOS transistor 60. The source of the third N-channel MOS transistor 60 associated with each column is connected to the drains of each of the second N-channel MOS transistors 32 from each of the first portions of the test probe circuits 18 in each column associated with the third N-channel MOS transistor 60. The gate of the third N-channel MOS transistor 60 is connected to the column select line so that the column with which the second portion of the test probe circuit 22 is associated may be selected if desired. The drain of the third N-channel MOS transistor 60 is connected to output line 20, along with the drains of each of the other third N-channel MOS transistors 60 in the second potions of the test probe circuits 22. Also connected between Vcc and the drains of each of N-channel MOS transistors 60 is load resistor 62. As in the first embodiment, the output line 20 is connected to a sense amplifier whose buffered output is connected to an output pad 26. However, unlike the first embodiment, the sense amplifier 64 inverts the output on line 20.

According to this embodiment of the present invention, logic modules in one or more selected columns are selected to form the fast wide decode. A column is selected by applying an electrical signal representing a HIGH logic level to the gate of N-channel MOS transistor 60 in the column being selected, and the logic modules are selected by applying an electrical signal representing a HIGH logic level to the gates of N-channel MOS transistors 32 in the logic modules being selected. Each of the selected logic modules are programmed to implement a portion of the decode. When the inputs to a selected logic module match the decode implemented in the logic module, an electrical signal representing a LOW logic level drives the gate of N-channel MOS transistor 30 in that logic module to indicate a match in the decode. The output of the decode is then sensed on output line 20.

Figure 7A:
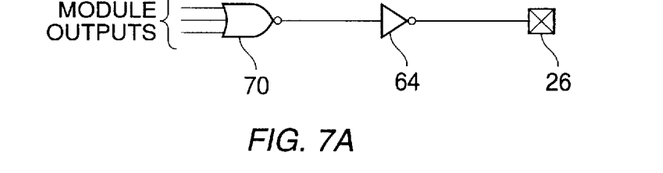
FIG. 7A is a schematic circuit diagram for a test probe circuit according to the present invention as shown in FIG. 6.

In FIG. 7A, a simplified schematic circuit diagram for a single column in the logic array is illustrated with the outputs of the logic modules in the same column being input to the NOR gate 70 formed by the first portions of the test probe circuits 18. The output of NOR gate 70 is connected to inverting sense amplifier 64.

Figure 7B:
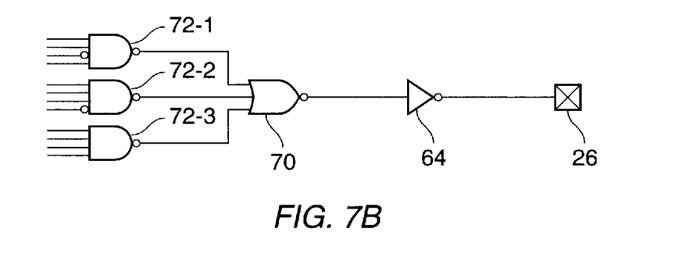
FIG. 7B is a schematic circuit diagram for a test probe circuit and logic function modules according to the present invention as shown in FIG. 6.
Figure 7C:
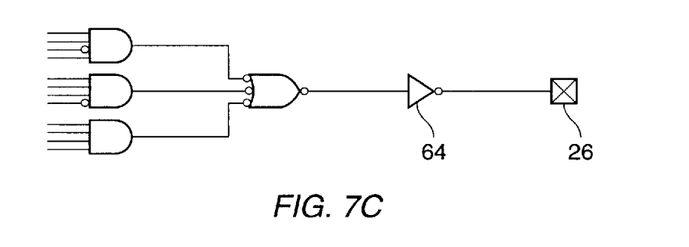
FIG. 7C is a simplified logic diagram of FIG. 7B according to the present invention.

In FIG. 7B, the four-input NAND gates 72-1 through 72-3 represent logic modules in the FPGA. Some of the inputs to NAND gates 72-1 through 72-3 are inverted for illustrative purposes only. It should be appreciated that any or all of the inputs may be inverted as required by the specific address being decoded. Generally, n four-input NAND gates 72 can implement a decoder capable of decoding an address of 4n bits. The outputs of the NAND gates 72-1 through 72-3 are connected to the circuit shown in FIG. 7A. As will be appreciated by those of ordinary skill in the art, FIGS. 7C and 7D are simplified logic diagrams of FIG. 7B.

Figure 7D:
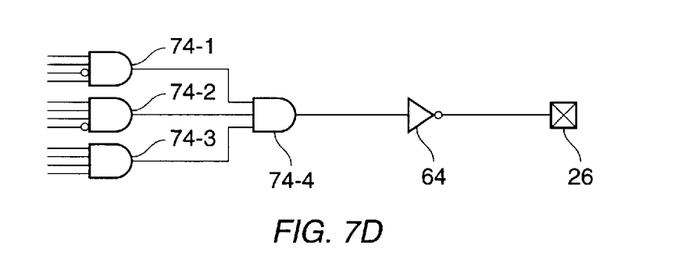
FIG. 7D is a simplified logic diagram of FIG. 7C according to the present invention.
Figure 7E:
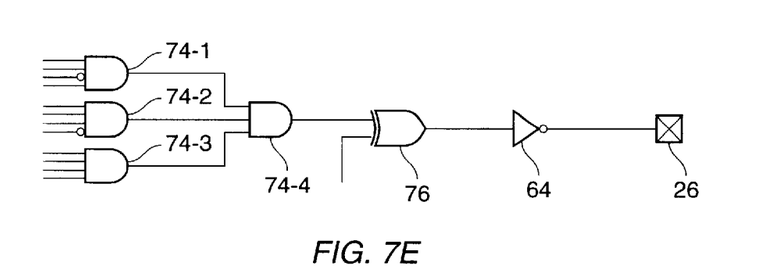
FIG. 7E is a simplified logic diagram of FIG. 7D according to the present invention.

Turning to FIG. 7D, and as described above, an AND gate with selectively inverted inputs can be used as a decoder. Accordingly, the AND gates 74-1 through 74-4 are equivalent to a single AND gate with inverted inputs that may be employed for address decoding. A HIGH output from AND gate 74-4 indicates a match in the decode, and as a consequence of the inversion on the inverting sense amplifier 64, the output from the inverting sense amplifier 64 will be active LOW. As illustrated in FIG. 7E, the output may be made active HIGH by inserting a polarity select using an XOR gate 76 between AND gate 74-4 and the inverting sense amplifier 64. It should be appreciated that in FIG. 6, the insertion of the XOR gate 76 would be between the tied together column select N-channel MOS transistors 60 and the inverting sense amplifier 64. It should be further appreciated that the XOR gate 76 could be inserted between the inverting sense amplifier 64 and the output pad 26.

Turning again to FIG. 6, the second portion of the test probe circuitry 22 formed by column select N-channel MOS transistors 60 operates differently than the first portion of the test probe circuitry 22 formed by the N-channel MOS transistor pair 34 and 36 in FIG. 2. Unlike the inverters formed by the N-channel MOS transistor pairs 34 and 36 in FIG. 2, the column select N-channel MOS transistors 60 when tied together can combine the individual column NOR gates into a single NOR gate. Accordingly, multiple columns can be tied together in forming the decoder.

Those of ordinary skill in the art can observe by inspection of FIG. 6 that if a HIGH signal (representing a non-match in the address decode) is presented to the gate of any of the N-channel MOS transistors 30 in any of the columns, output line 20 will be pulled LOW when the appropriate column select N-channel MOS transistor 60 is turned on. As a consequence, the output of inverting sense amplifier 64 will be HIGH indicating that there was no match of the address being decoded.

Figure 8:
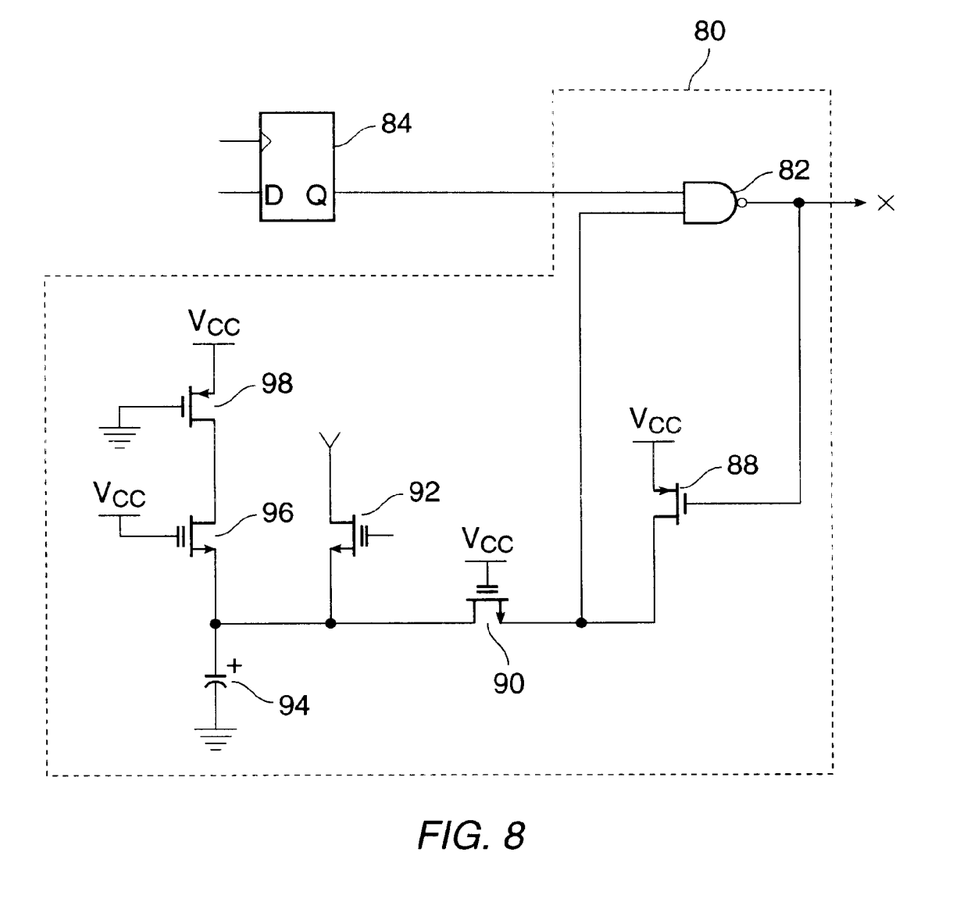
FIG. 8 is a row permanent select circuit according to the present invention.

As described above, the logic modules 12 are selected by the outputs of the row and column select registers. In implementing the fast, wide decode, the rows and columns of the selected logic modules 12 can be permanently programmed. In FIG. 8, a row permanent programming circuit 80 is shown. An identical circuit can also be used to program a column permanently.

Referring now to FIG. 8, in the row permanent select circuit 80, a NAND gate 82 has first and second inputs and an output. The first input of NAND gate 82 is connected to D flip-flop 84 which is not part of the row permanent select circuit 80, but rather, when the row permanent select circuit 80 has not been activated, provides the row select signals as described above. The second input of NAND gate 82 is connected to the common connection of the drain of P-channel MOS transistor 88 and the source of high voltage N-channel MOS transistor 90. The source of P-channel MOS transistor 88 is connected to Vcc and the gate is connected to the output of NAND gate 82. P-channel MOS transistor 88 restores the threshold drop due to high voltage N-channel MOS transistor 90 to prevent excessive power consumption in NAND gate 82.

The drain of high voltage N-channel MOS transistor 90 is connected to the common node comprising the source of high voltage N-channel MOS transistor 92, the first electrode of antifuse 94 and the source of high voltage N-channel MOS transistor 96. The gate of high voltage N-channel MOS transistor 92 is connected to the signal which will permanently program the selected row, and the drain of high voltage N-channel MOS transistor 92 is connected to a source of programming voltage which in the preferred embodiment is a vertical interconnect track. The second electrode of antifuse 94 is connected to ground.

When the programming signal is supplied to the gate of high voltage N-channel MOS transistor 92, the voltage on the vertical track connected to the drain of high voltage N-channel MOS transistor 92 will program the antifuse 94. Programming the antifuse ties the second input of the NAND gate 82 to a ground potential. As a consequence, the output of the NAND gate will always be HIGH, and the row will be permanently selected. The drain of high voltage N-channel MOS transistor 96 is connected to the drain of P-channel MOS transistor 98, and the gate of high voltage N-channel MOS transistor 96 is connected to Vcc. The source of P-channel MOS transistor 98 is connected to Vcc, and the gate is connected to ground. High voltage N-channel MOS transistor 96 and P-channel MOS transistor 98 form a current source to provide a sensing current to antifuse 94. High voltage N-channel MOS transistor 90 is a pass transistor to whose gate is connected to Vcc to protect NAND gate 82 and P-channel MOS transistor 88 from high voltage during programming of antifuse 94.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for implementing a wide decode in a field programmable gate array arranged as rows and columns of logic modules and having a test probe circuit associated with each column of the logic modules, each test probe circuit including a first row select portion disposed in each of the logic modules, and a second column portion associated with each of the columns, comprising the steps of:

selecting a test probe circuit by driving the second column portion of said test probe circuit with an electrical signal sufficient to select said test probe circuit;

selecting at least one logic module associated with said test probe circuit by driving the first row select portion of said at least one logic module with an electrical signal sufficient to select said at least one logic module; and driving said first row select portion of said at least one logic module by an output of said at least one logic module, wherein said output at a first logic level represents a match in a portion of the wide decode at the inputs of said at least one logic module and said output at a second logic level represents a non-match in a portion of the wide decode at the inputs of said at least one logic module.

2. A method for implementing a wide decode in a field programmable gate array arranged as rows and columns of logic modules and having a test probe circuit associated with each column of the logic modules, each test probe circuit including a first row select portion disposed in each of the logic modules, and a second column portion associated with each of the columns, comprising the steps of:

selecting a plurality of test probe circuits by driving the second column portion of each of said plurality of test probe circuits with an electrical signal sufficient to select said plurality of test probe circuits;

selecting at least one logic module associated with each of said plurality of said test probe circuits by driving the first row select portion of said at least one logic module with an electrical signal sufficient to select said at least one logic module;

driving said first row select portion of said at least one logic module by an output of said at least one logic module; and sensing a logic level in each second column select portion of said plurality of test probe circuits to determine whether a match in the decode at the inputs of said at least one logic module occurred.

3. A method for implementing a wide decode in a field programmable gate array arranged as rows and columns of logic modules and having a test probe circuit associated with each column of the logic modules, each test probe circuit including first and second transistors disposed in each of the logic modules, each of the first and second transistors having a gate, a source, and a drain, and third and fourth transistors, each of the third and fourth transistors having a gate, a source, and a drain, the sources of the first transistors connected to a first reference potential, the drain of the first transistor in a same logic module connected to the source of the second transistor in the same logic module, the gates of the second transistors in a same row connected together, the drains of the second transistors in a same test probe circuit connected to the gate of the third transistor in the same test probe circuit and to a second reference potential through a first load device, the sources of the third transistors connected to the first reference potential, the drain of the third transistor connected to the source of the fourth transistor in the test probe circuit, the drains of the fourth transistors connected together and to the second reference potential through a second load device comprising the steps of:

selecting a test probe circuit by driving the gate of the fourth transistor in said test probe circuit with an electrical signal sufficient to turn-on said fourth transistor;

selecting at least one logic module associated with said test probe circuit by driving the gate of the second transistor disposed in said at least one logic module with an electrical signal sufficient to turn-on said second transistor; and driving the gate of the first transistor in said at least one logic module by an output of said at least one logic module, wherein said output at said first logic level represents a match in a portion of the wide decode at the inputs of said at least one logic module and said output at a second logic level represents a non-match in a portion of the wide decode at the inputs of said at least one logic module.

4. A method for implementing a wide decode in a field programmable gate array arranged as rows and columns of logic modules and having a test probe circuit associated with each column of the logic modules, each test probe circuit including first and second transistors disposed in each of the logic modules, each of the first and second transistors having a gate, a source, and a drain, and third and fourth transistors, each of the third and fourth transistors having a gate, a source, and a drain, the sources of the first transistors connected to a first reference potential, the drain of the first transistor in a same logic module connected to the source of the second transistor in the same logic module, the gates of the second transistors in a same row connected together, the drains of the second transistors in a same test probe circuit connected to the gate of the third transistor in the same test probe circuit and to a second reference potential through a first load device, the sources of the third transistors connected to the first reference potential, the drain of the third transistor connected to the source of the fourth transistor in the test probe circuit, the drains of the fourth transistors connected together and to the second reference potential through a second load device comprising the steps of:

selecting a test probe circuit by driving the gate of the fourth transistor in said test probe circuit with an electrical signal sufficient to turn-on said fourth transistor;

selecting at least one logic module associated with said test probe circuit by driving the gate of the second transistor disposed in said at least one logic module with an electrical signal sufficient to turn-on said second transistor;

driving the gate of the first transistor in said at least one logic module by an output of said at least one logic module; and sensing a logic level at the drain of said fourth transistor to determine whether a match in the decode at the inputs of said at least one logic module occurred.

5. A method for implementing a wide decode in a field programmable gate array arranged as rows and columns of logic modules and having a test probe circuit associated with each column of the logic modules, each test probe circuit including first and second transistors disposed in each of the logic modules, each of the first and second transistors having a gate, a source, and a drain, third and fourth transistors, each of the third and fourth transistors having a gate, a source, and a drain, and an exclusive-OR gate having first and second inputs and an output, the sources of the first transistors connected to a first reference potential, the drain of the first transistor in a same logic module connected to the source of the second transistor in the same logic module, the gates of the second transistors in a same row connected together, the drains of the second transistors in a same test probe circuit connected to the first input of the exclusive-OR gate and to a second reference potential through a first load device, the output of the exclusive-OR gate connected to the gate of the third transistor in the same test probe circuit, the sources of the third transistors connected to the first reference potential, the drain of the third transistor connected to the source of the fourth transistor in the test probe circuit, the drains of the fourth transistors connected together and to the second reference potential through a second load device comprising the steps of:

selecting a plurality of test probe circuits by driving the gate of the fourth transistor in each of said plurality of test probe circuits with an electrical signal sufficient to turn-on said fourth transistor;

selecting at least one logic module associated with each of said plurality of test probe circuits by driving the gate of the second transistor disposed in said at least one logic module with an electrical signal sufficient to turn-on said second transistor;

driving the second input of each exclusive-OR gate associated with a selected test probe circuit with an electrical signal sufficient to cause the output level of each of said exclusive-OR gates to be an inversion of the logic level at the first input of each of said exclusive-OR gate; and driving the gate of the first transistor in said at least one logic module by an output of said at least one logic module, wherein said output at said first logic level represents a match in a portion of the wide decode at the inputs of said at least one logic module and said output at a second logic level represents a non-match in a portion of the wide decode at the inputs of said at least one logic module.

6. A method for implementing a wide decode in a field programmable gate array arranged as rows and columns of logic modules and having a test probe circuit associated with each column of the logic modules, each test probe circuit including first and second transistors disposed in each of the logic modules, each of the first and second transistors having a gate, a source, and a drain, third and fourth transistors, each of the third and fourth transistors having a gate, a source, and a drain, and an exclusive-OR gate having first and second inputs and an output, the sources of the first transistors connected to a first reference potential, the drain of the first transistor in a same logic module connected to the source of the second transistor in the same logic module, the gates of the second transistors in a same row connected together, the drains of the second transistors in a same test probe circuit connected to the first input of the exclusive-OR gate and to a second reference potential through a first load device, the output of the exclusive-OR gate connected to the gate of the third transistor in the same test probe circuit, the sources of the third transistors connected to the first reference potential, the drain of the third transistor connected to the source of the fourth transistor in the test probe circuit, the drains of the fourth transistors connected together and to the second reference potential through a second load device comprising the steps of:

selecting a plurality of test probe circuits by driving the gate of the fourth transistor in each of said plurality of test probe circuits with an electrical signal sufficient to turn-on said fourth transistor;

selecting at least one logic module associated with each of said plurality of test probe circuits by driving the gate of the second transistor disposed in said at least one logic module with an electrical signal sufficient to turn-on said second transistor;

driving the second input of each exclusive-OR gate associated with a selected test probe circuit with an electrical signal sufficient to cause the output level of each of said exclusive-OR gates to be an inversion of the logic level at the first input of each of said exclusive-OR gate;

driving the gate of the first transistor in said at least one logic module by an output of said at least one logic module; and sensing a logic level at the drain of said fourth transistor to determine whether a match in the decode at the inputs of said at least one logic module occurred.

7. A method for implementing a wide decode in a field programmable gate array arranged as rows and columns of logic modules and having a test probe circuit associated with each column of the logic modules, each test probe circuit including first and second transistors disposed in each of the logic modules, each of the first and second transistors having a gate, a source, and a drain, and third transistors, each of the third transistors having a gate, a source, and a drain, the sources of the first transistors connected to a first reference potential, the drain of the first transistor in a same logic module connected to the source of the second transistor in the same logic module, the gates of the second transistors in a same row connected together, the drains of the second transistors in a same test probe circuit connected to the source of the third transistor in the test probe circuit, the drains of the third transistors connected together and to a second reference potential through a load device comprising the steps of:

selecting a plurality of test probe circuits by driving the gate of the third transistor in each of said plurality of test probe circuits with an electrical signal sufficient to turn-on said third transistor;

selecting at least one logic module associated with each of said plurality of test probe circuits by driving the gate of the second transistor disposed in said at least one logic module with an electrical signal sufficient to turn-on said second transistor; and driving the gate of the first transistor in said at least one logic module by an output of said at least one logic module, wherein said output at said first logic level represents a match in a portion of the wide decode at the inputs of said at least one logic module and said output at a second logic level represents a non-match in a portion of the wide decode at the inputs of said at least one logic module.

8. A method for implementing a wide decode in a field programmable gate array arranged as rows and columns of logic modules and having a test probe circuit associated with each column of the logic modules, each test probe circuit including first and second transistors disposed in each of the logic modules, each of the first and second transistors having a gate, a source, and a drain, and third transistors, each of the third transistors having a gate, a source, and a drain, the sources of the first transistors connected to a first reference potential, the drain of the first transistor in a same logic module connected to the source of the second transistor in the same logic module, the gates of the second transistors in a same row connected together, the drains of the second transistors in a same test probe circuit connected to the source of the third transistor in the test probe circuit, the drains of the third transistors connected together and to a second reference potential through a load device comprising the steps of:

selecting a plurality of test probe circuits by driving the gate of the third transistor in each of said plurality of test probe circuits with an electrical signal sufficient to turn-on said third transistor;

selecting at least one logic module associated with each of said plurality of test probe circuits by driving the gate of the second transistor disposed in said at least one logic module with an electrical signal sufficient to turn-on said second transistor;

driving the gate of the first transistor in said at least one logic module by an output of said at least one logic module; and sensing a logic level at the drain of said third transistor to determine whether a match in the decode at the inputs of said at least one logic module occurred.

\* \* \* \* \*